United States Patent [19]

Argentieri

[11] Patent Number: 4,555,587

[45] Date of Patent: Nov. 26, 1985

[54] ENCLOSURE FOR A POWER SUPPLY

[75] Inventor: Michael A. Argentieri, West Orange, N.J.

[73] Assignee: International Telephone and Telegraph Corporation, New York, N.Y.

[21] Appl. No.: 512,277

[22] Filed: Jul. 11, 1983

[51] Int. Cl.[4] .......................... H05K 5/00; H05K 7/20

[52] U.S. Cl. .................................. 174/11 R; 137/576; 137/579; 174/12 R; 174/17 LF

[58] Field of Search .............. 174/11 R, 11 BH, 12 R, 174/12 BH, 15 R, 17 R, 17 LF, 17 GF, 17 VA; 137/38, 572, 574, 575, 576, 579; 220/85 S, 85 TC; 361/385

[56] References Cited

U.S. PATENT DOCUMENTS 3,091,722 5/1963 Borowiec et al. ............ 174/17 R X

FOREIGN PATENT DOCUMENTS 1058535 7/1979 Canada ................................ 137/574
1223044 8/1966 Fed. Rep. of Germany .... 174/12 R
989041 5/1951 France .............................. 174/12 R
697012 9/1953 United Kingdom ............. 174/12 R

*Primary Examiner*—Laramie E. Askin
*Attorney, Agent, or Firm*—John T. O'Halloran; Peter R. Ruzek

[57] ABSTRACT

An enclosure includes a closed housing having a wall dividing the housing into a first compartment containing a high voltage portion of the power supply and a second compartment containing a low voltage portion of the power supply. A dielectric fluid fills the first compartment and partially fills the second compartment. A first check valve disposed in the wall enables fluid to flow from the first compartment to the second compartment during a temperature increase to compensate for expansion of the fluid in the first compartment. A second check valve disposed in the wall, in communication with the fluid in the second compartment, enables the fluid to flow from the second compartment to the first compartment during a temperature decrease to maintain the first compartment full of the fluid. A feeder line is provided in the second compartment operative at all times to have one end in communication with the second valve and the other end submerged in the fluid in the second compartment independent of the attitude of the housing within an acceptable attitude range.

15 Claims, 2 Drawing Figures

ENCLOSURE FOR A POWER SUPPLY

BACKGROUND OF THE INVENTION

The present invention relates to power supplies and, more particularly, to a mechanical enclosure for power supplies.

Power supplies and, in particular, the high voltage portions of power supplies preferably are maintained completely enclosed in a dielectric fluid throughout the complete environmental temperature range of minus 54° C. to plus 125° C. It is also desirable during the environmental temperature excursion, to maintain the internal pressures of the enclosures for the power supply so that it will be not exceed 15 pounds per square inch. The dielectric fluid enclosing at least the high voltage portion of the power supply has a dielectric constant of sufficient value so that the high voltage power supply will not be provided with voltage breakdown or arcing paths and it is desired that this dielectric constant of the fluid be maintained throughout the above-mentioned environmental temperature range. To maintain the dielectric constant at the value of the dielectric fluid employed, the housing containing the high voltage section of the power supply encloses the dielectric fluid and must be maintained full so that the dielectric constant of the fluid is not diminished by the dielectric constant of other materials, such as vapors and air. In addition, the dielectric fluid provides for heat transfer through its thermal conductivity and to maintain the thermal conductivity at the desired value, it is desired to also maintain the enclosure containing the high voltage section of the power supply and the dielectric fluid full of the dielectric fluid.

In the past, the housing for the power supply, or at least the high voltage section of the power supply, has been provided with an elastomeric membrane or elastic bellows such that, when the environmental temperature increases, the dielectric fluid can expand into this membrane and, when the temperature decreases, the fluid that is present in the membrane can then be returned to the enclosure so that the enclosure of the power supply is maintained full of the dielectric fluid at all times over the temperature range.

Such an arrangement of the prior art adds undesired volume to a vehicle containing the power supply, where volume of equipment contained in the vehicle is important. Such a vehicle can be an aircraft or space vehicle, where it is desired to maintain the volume of all components therein as small as possible.

SUMMARY OF THE INVENTION

An object of the present invention is to provide an improved enclosure for a power supply.

Another object of the present invention is to provide an improved enclosure for a power supply which will enable the high voltage portion of the power supply to be contained in a compartment which is full of the dielectric fluid at all times throughout the complete environmental temperature range of minus 54° C. to plus 125° C.

A feature of the present invention is the provision of an arrangement to enclose a power supply comprising a closed housing having a wall therein dividing the interior of the housing into a first compartment containing a high voltage portion of the power supply and a second compartment containing a low voltage portion of the power supply; a dielectric fluid filling the first compartment and partially filling the second compartment; a first check valve disposed in the wall to enable the fluid to flow from the first compartment to the second compartment during a temperature increase to compensate for expansion of the fluid in the first compartment; and a second check valve disposed in the wall in communication with the fluid in the second compartment to enable the fluid to flow from the second compartment to the first compartment during a temperature decrease to maintain the first compartment full of the fluid.

Another feature of the present invention is the provision of a rotary joint comprising a first hollow portion extending at a right angle from and secured to a rigid member; a second hollow portion extending parallel to the rigid member; and a hollow bellows member interconnecting the first and second portions to enable rotations of the second portion with respect to the first portion.

Still a further feature of the present invention is the provision of a fluid feeder line to connect fluid in one compartment of a closed housing to another compartment of the housing separated from the one compartment by a wall, comprising a first hollow portion disposed in the one compartment extending at a right angle from, secured to, and in communication with an aperture through, the wall; a second hollow portion disposed in the one compartment extending parallel to the wall; and a bellows-type hollow rotary joint disposed in the one compartment interconnecting the first and second portions to enable rotation of the second portion relative to the first portion.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
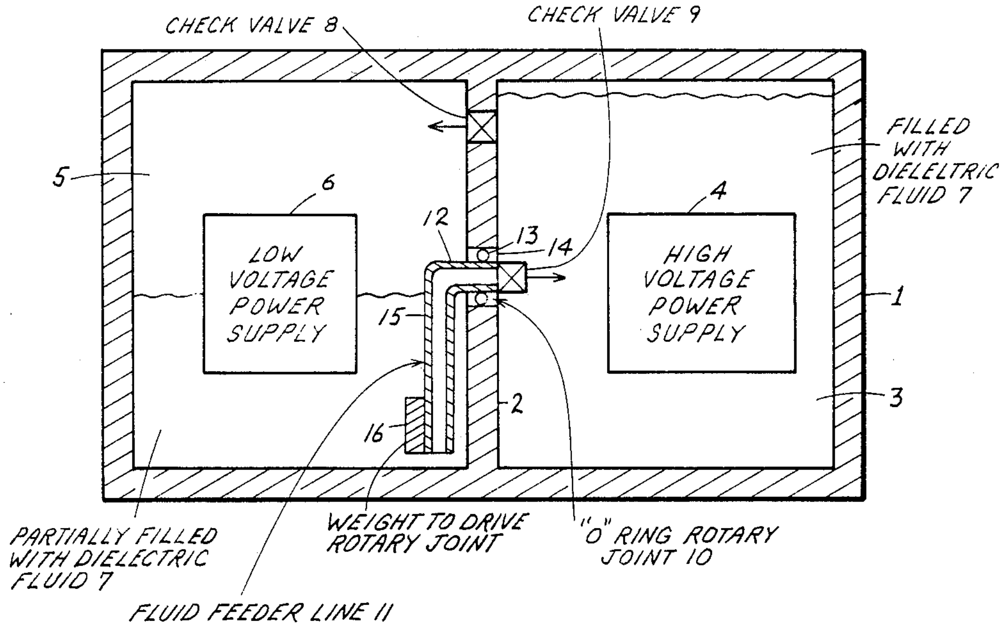
FIG. 1 is a cross-sectional view in schematic form of a first embodiment of an enclosure to enclose a power supply in accordance with the principles of the present invention.

Referring to FIG. 1, there is illustrated therein a cross-section in schematic form of an enclosure for a power supply in accordance with the principles of the present invention, including a housing 1 containing therein a wall 2 which divides the interior of the housing 1 into a compartment 3 containing a high voltage portion 4 of the power supply and a compartment 5 containing a low voltage portion 6 of the power supply. For electrical reasons, the low voltage compartment 5 requires approximately one-third of the overall power supply volume, making this portion 5 ideally suited to serve as a fluid expansion chamber. The compartment 3 containing the high voltage portion 4 of the power supply is filled with a dielectric fluid 7 and the compartment 5 containing the low voltage portion 6 of the power supply is partially filled with the dielectric fluid 7. This fluid 7 may be a liquid or a gas having the desired dielectric constant.

To ensure that the high voltage compartment 3 is always full of fluid, two check valves 8 and 9 are employed. Fluid 7 in compartment 3 will expand with increasing temperature and flow through the high pressure check valve 8 into compartment 5 containing the low voltage portion 6 of the power supply. It should be noted that the high voltage section or compartment 3 will always be at a higher pressure than the compartment 5 whenever the temperature of the power supply is increasing and at a lower pressure whenever the temperature of the power supply is decreasing. During temperature decrease, therefore, fluid will flow through the low pressure check valve 9 back into the compartment 3 containing the high voltage portion 4 of the power supply. This combination of pressures and two check valves will always assure that the compartment 3 containing the high voltage portion 4 of the power supply is full of the dielectric fluid. To provide the desired operation of the enclosure to maintain the high voltage power supply compartment 3 full of the dielectric fluid, it is necessary to construct the low pressure check valve 9 so that it will always have its input port submerged in the fluid 7 in compartment 5 so long as the housing 1 assumes an attitude within a predetermined acceptable attitude range. A rotary joint actuated by a pendulum will meet this requirement.

One rotary joint that will enable the check valve 9 to have its input port completely submerged in fluid 7 of compartment 5 is an "O" ring rotary joint 10 having a fluid feeder line 11 with one portion 12 encircled by the "O" ring 13 and contained within an aperture 14 of wall 2 and a second portion 15 extending parallel to wall 2 in a continuous fashion with portion 12 which extends in a perpendicular relationship with wall 2. A weight 16 drives the feeder line 11 in the rotary joint 10. Such a rotary joint is well within the state of the art for normal (larger than 100 pounds per square inch) pressures usually encountered in hydraulic systems. For low pressures, however, special care must be exercised in constructing the proper interference between the "O" ring and the wall of the aperture 14 through wall 2 to ensure a leak-proof joint. These construction considerations result in a rotary joint that requires a large driving torque. In the construction of the high voltage power supply rotary joint, where it was necessary to drive the rotary joint by means of a pendulous weight 16 a one pound weight was required to drive the rotary joint. This could be a drawback since a large driving torque and an uncertainty existed over a large temperature range for the "O" ring rotary joint, which had to be both liquid and gas tight.

Figure 2:
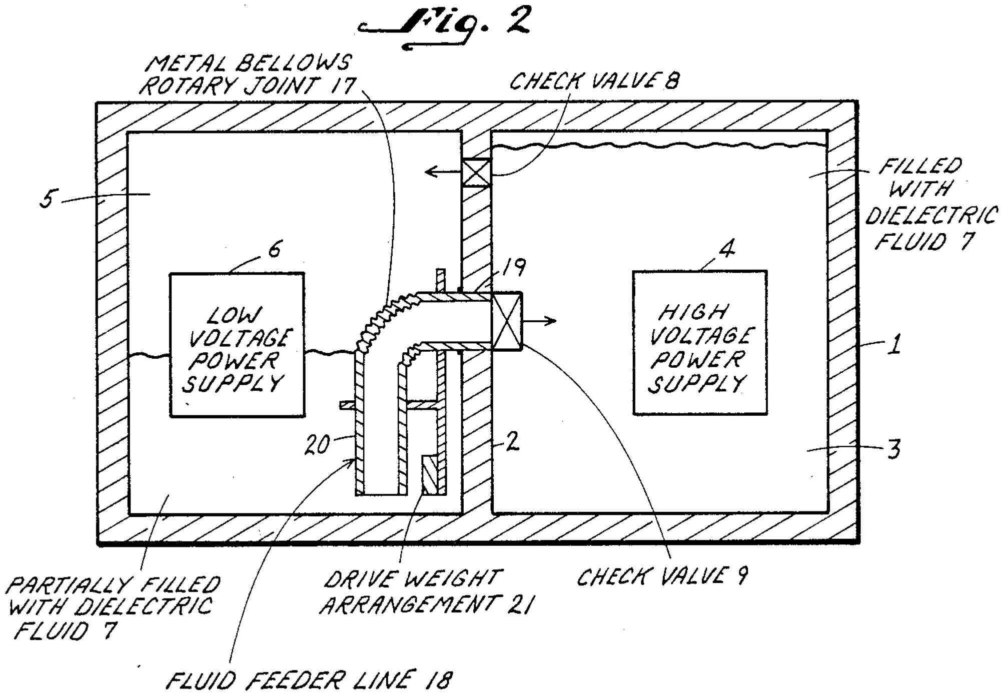
FIG. 2 is a cross-sectional view in schematic form of a second embodiment of an enclosure for a power supply in accordance with the principles of the present invention.

To overcome this tendency of a large driving torque and uncertainty of the rotary seal over a large temperature range, a seal-less rotary joint which is both liquid and gas tight and which requires a relatively low driving torue (less than 2 ounces) is disclosed in the embodiment of FIG. 2 which is identical to that of FIg. 1 except for the rotary joint. Thus, the same reference characters will be used in FIG. 2 as those used in FIG. 1 for identical structures.

The seal-less rotary joint is a metal bellows rotary joint 17 included in fluid feeder line 18 which includes a first portion 19 extending at a right angle to wall 2 which extends through an aperture thereof in communication with the check valve 9 which is soldered in a fixed manner to wall 2. Feeder line 18 includes a second portion 20 which extends parallel to wall 2 having the open end thereof in communication with the fluid 7 contained in the compartment 5 containing the low voltage portion 6 of the power supply. Interconnecting portions 19 and 20 of feeder line 18 is metal bellows 17 which is like a flexible hospital straw which is capable of rotating any number of 360° in either direction in the embodiment of FIG. 2.

The feeder line 18 and its rotary joint 17 are driven by a pendulous weight arrangement 21 to drive the metal bellows rotary joint 17 so as to maintain the open end of section 20 of the feeder line 18 immersed in the fluid 7 of compartment 5 at all timees independent of the attitude of the housing 1 so long as this attitude is within a predetermined acceptable attitude range. The weight of the drive weight arrangement 21 is less than 2 ounces thereby achieving a weight saving which, of course, is important in aircraft and space vehicles.

As a result of the overall approach, the weight savings have been estimated to be 12 to 14 pounds. This includes the elimination of the special expansion bellows or membrane and all other structure associated therewith even though the new arrangement employs more fluid than in the prior art arrangement.

While I have described above the principles of my invention in connection with specific apparatus, it is to be clearly understood that this description is made only by way of example and not as a limitation to the scope of my invention as set forth in the objects thereof and in the accompanying claims.

I claim:

1. An arrangement enclosing a power supply having a high voltage portion and a low voltage portion, comprising:

- a closed housing having a wall therein dividing the interior of said housing into a first compartment containing the high voltage portion of the power supply and a second compartment containing the low voltage portion of the power supply;
- a dielectric fluid filling said first compartment and partially filling said second compartment;
- a first check valve disposed in said wall to enable said fluid to flow from said first compartment to said second compartment during a temperature increase to compensate for expansion of said fluid in said first compartment; and
- a second check valve disposed in said wall in communication with said fluid in said second compartment to enable said fluid to flow from said second compartment to said first compartment during a temperature decrease to maintain said first compartment full of said fluid.

2. An arrangement according to claim 1, wherein said dielectric fluid is a dielectric liquid.

3. An arrangement according to claim 1, wherein said dielectric fluid is a dielectric gas.

4. An arrangement for enclosing a power supply having a high voltage portion and a low voltage portion, comprising

- a closed housing having a wall therein dividing the interior of said housing into a first compartment for containing a high voltage portion of a power supply and a second compartment for containing a low voltage portion of a power supply;
- a dielectric fluid filling said first compartment and partially filling said second compartment;
- a first check valve disposed in said wall to enable said fluid to flow from said first compartment to said second compartment during a temperature increase to compensate for expansion of said fluid in said first compartment;

a second check valve disposed in said wall in communication with said fluid in said second compartment to enable said fluid to flow from said second compartment to said first compartment during a temperature decrease to maintain said first compartment full of said fluid; and a fluid feeder device disposed in said second compartment operative at all times to have one end in communication with said second check valve and the other end submerged in said fluid of said second compartment independent of the attitude of said housing within a predetermined acceptable attitude range.

5. An arrangement according to claim 4, wherein said dielectric fluid is a dielectric liquid.

6. An arrangement according to claim 5, wherein said fluid feeder device includes a feeder line having a first portion thereof extending at a right angle from said wall and a second portion extending from said first portion in a continuous manner parallel to said wall, the free end of said first portion providing said one end of said device and the free end of said second portion providing said other end of said device;

an "O" ring rotary joint disposed to encircle said first portion adjacent said second check valve and within an aperture of said wall to enable rotation of said feeder line, and a weight acting upon said second portion to drive said feeder line in said rotary joint in response to attitude changes of said housing to maintain said other end of said device submerged in said dielectric liquid of said second compartment independent of the attitude of said housing within said attitude range.

7. An arrangement according to claim 5, wherein said fluid feeder device includes a feeder line having a first portion thereof extending at a right angle from said wall, a second portion extending parallel to said wall and a bellows-type rotary joint interconnecting said first and second portions to enable rotation of said second portion with respect to said first portion, said first portion having a free end, corresponding to said one end of said device, secured in an aperture of said wall in communication with said second check valve, and a weight acting upon said second portion to drive said second portion relative to said first portion to maintain the free end of said second portion, corresponding to said other end of said device, submerged in said dielectric liquid of said second compartment independent of the attitude of said housing within said attitude range.

8. An arrangement according to claim 7, wherein said bellows-type rotary joint is a metallic bellows-type rotary joint.

9. An arrangement according to claim 4, wherein said dielectric fluid is a dielectric gas.

10. An arrangement according to claim 9, wherein said fluid feeder device includes a feeder line having a first portion thereof extending at a right angle from said wall and a second portion extending from said first portion in a continuous manner parallel to said wall, the free end of said first portion providing said one end of said device and the free end of said second portion providing said other end of said device, an "O" ring rotary joint disposed to encircle said first portion adjacent said second check valve and within an aperture of said wall to enable rotation of said feeder line, and a weight acting upon said second portion to drive said feeder line in said rotary joint in response to attitude changes of said housing to maintain said other end of said device located at the then bottom region of said second compartment independent of the attitude of said housing within said attitude range.

11. An arrangement according to claim 9, wherein said fluid feeder device includes a feeder line having a first portion thereof extending at a right angle from said wall, a second portion extending parallel to said wall and a bellows-type rotary joint interconnecting said first and second portions to enable rotation of said second portion with respect to said first portion, said first portion having a free end, corresponding to said one end of said device, secured in an aperture of said wall in communication with said second check valve, and a weight acting upon said second portion to drive said second portion relative to said first portion to maintain the free end of said second portion, corresponding to said other end of said device, located at the then bottom region of said second compartment independent of the attitude of said housing within said attitude range.

12. An arrangement according to claim 11, wherein said bellows-type rotary joint is a metallic bellows-type rotary joint.

13. An arrangement according to claim 4, wherein said fluid feeder device includes a feeder line having a first portion thereof extending at a right angle from said wall and a second portion extending from said first portion in a continuous manner parallel to said wall, the free end of said first portion providing said one end of said device and the free end of said second portion providing said other end of said device, an "O" ring rotary joint disposed to encircle said first portion adjacent said second check valve and within an aperture of said wall to enable rotation of said feeder line, and a weight acting upon said second portion to drive said feeder line in said rotary joint in response to attitude changes of said housing to maintain said other end of said device submerged in said fluid of said second compartment independent of the attitude of said housing within said attitude range.

14. An arrangement according to claim 4, wherein said fluid feeder device includes a feeder line having a first portion thereof extending at a right angle from said wall, a second portion extending parallel to said wall and a bellows-type rotary joint interconnecting said first and second portions to enable rotation of said second portion with respect to said first portion, said first portion having a free end, corresponding to said one end of said device, secured in an aperture of said wall in communication with said second check valve, and a weight acting upon said second portion to drive said second portion relative to said first portion to maintain the free end of said second portion, corresponding to said other end of said device, submerged in said fluid of said second compartment independent of the attitude of said housing within said attitude range.

15. An arrangement according to claim 14, wherein said bellows-type rotary joint is a metallic bellows-type rotary joint.

* * * * *